United States Patent [19]

Jain

[11] Patent Number: 5,212,706
[45] Date of Patent: May 18, 1993

[54] LASER DIODE ASSEMBLY WITH TUNNEL JUNCTIONS AND PROVIDING MULTIPLE BEAMS

[75] Inventor: Faquir C. Jain, Storrs, Conn.

[73] Assignee: University of Connecticut, Storrs, Conn.

[21] Appl. No.: 802,056

[22] Filed: Dec. 3, 1991

[51] Int. Cl.$^5$ .............................................. H01S 3/19
[52] U.S. Cl. ..................................... 372/50; 372/45; 372/23; 372/97; 372/44
[58] Field of Search ....................... 372/50, 45, 97, 23, 372/44

[56] References Cited

U.S. PATENT DOCUMENTS 4,577,207 3/1986 Copeland ............................. 372/50

FOREIGN PATENT DOCUMENTS 0229487 9/1990 Japan .................................... 372/45

OTHER PUBLICATIONS

Bistability in an AlAs-GaAs-InGaAs vertical-cavity Surface-Emitting Laser, D. G. Deppe, C. Lei, T. J. Rogers and B. G. Streetman Lett. 58 (23) American Institute of Physics pp. 2616-2618 (Jun. 10, 1991).
p-n-p-n Optical Detectors and Light-Emitting Diodes, John A. Copeland, Andrew G. Dentai, and Tien Pei Lee, IEEE Journal of Quantum Electronics vol. QE-14, No. 11, pp. 810-813 (Nov. 1978).
Reproducible Integration of Multijunction Cascade Cell Components, C. R. Lewis, C. W. Ford, G. F. Virshup, B. A. Arau R. T. Green and J. G. Werthen; Elsevier Sequoia/Printed in the Netherlands pp. 253-261 (1987).
GaAs-AlGaAs Tunnel Junctions for Multigap Cascade Solar Cells D. L. Miller, S. W. Zehr and J. S. Harris, Jr. American Institute of Physics pp. 744-748 (Jan. 1982).
Observations Concerning Self-Damage in GaAs Injection Lasers, H. Kressel, Journal of Quantum Electronics, vol. QE-4, No. 4 (Apr. 1968), p. 176.
Multilayer GaAs Injection Laser, Walter F. Kosonocky, Roy H. Cornely and I. J. Hegyi, Journal of Quantum Electronics, vol. QE-4 No. 4 (Apr. 1968); pp. 176-179.
Barrier-Controlled Low-Threshold pnpn GaAs Heterostructure Laser C. P. Lee, A. Gover, S. Margalit, I. Samid and A. Yariv, American Institute of Physics, vol. 30, No. 10, (May 15, 1977), pp. 535-538.

*Primary Examiner*—Georgia Y. Epps

[57] ABSTRACT

A laser diode assembly provides multiple output beams from multiple p-n junctions in a multiplicity of stacked laser diodes with at least one tunnel junction. A semiconductor substrate has a multiplicity of superposed semiconductor laser stacks thereon each having an active layer sandwiched between p and n layers, and at least one pair of adjacent semiconductor laser stacks has a tunnel junction therebetween. When a potential is applied across the ohmic contacts on the outer surface of the substrate and the outer surface of the uppermost semiconductor laser stack, lasing is produced in the semiconductor stacks to form multiple beams. The tunnel junction may be provided by highly doped p+, n+layers between the stacks, or it may be provided by highly doped abutting p+, n+surface portions in the adjacent stacks. Tunnel junctions may be provided at the interfaces between all of the stacks, or between all but one pair of the adjacent stacks. The assembly may be edge emitting or surface emitting, and it may include single or multiple quantum well configurations and distributed feedback configuration.

15 Claims, 7 Drawing Sheets

LASER DIODE ASSEMBLY WITH TUNNEL JUNCTIONS AND PROVIDING MULTIPLE BEAMS

BACKGROUND OF THE INVENTION

The present invention relates to laser diodes, and more particularly, to laser diode assemblies employing a multiplicity of laser diodes to provide a multiplicity of laser beam outputs.

Laser diodes are widely employed for numerous applications wherein low power laser beams can be utilized to effect switching, illumination, measurement and other functions. Until recently, such laser diodes have been limited to generation of a single output beam. Recently there have been proposed light emitting diode assemblies which contain p-n, p-n structures, as described by Copeland et al in *p-n, p-n Optical Detectors and Light Emitting Diodes*, IEEE Journal of Quantum Electronics, Volume QE-14, No. 11 (November 1978); by Deppe et al. in *Bi-Stability In An Alas-GaAs-InGaAs Vertical Cavity Surface Emitting Laser*, Applied Physics 58 (23) (June-1991) and Kosonocky et al. in *Multilayer GaAs Injection Laser*, IEEE Journal of Quantum Electronics, Vol. QE-4, No. 4 (April 1968).

It is an object of the present invention to provide a novel stacked laser diode assembly providing multiple laser beam outputs which is highly efficient.

It is also an object to provide such a diode assembly in which laser beams of different wavelengths are generated.

Another object is to provide such a laser diode assembly which may be fabricated readily and which may be tailored to include various features.

A further object is to provide such a diode assembly which includes switching.

SUMMARY OF THE INVENTION

It has now been found that the foregoing and related objects may be readily attained in a laser diode assembly providing multiple output beams and having multiple p-n junctions separated by at least one tunnel junction. The laser diode assembly includes a semiconductor substrate and a multiplicity of superposed semiconductor laser stacks thereon, each having an active layer sandwiched between p and n layers, and at least one pair of adjacent semiconductor laser stacks has a tunnel junction therebetween. Ohmio contacts are provided on the outer surface of the substrate and the outer surface of the uppermost semiconductor laser stack, whereby, a potential applied across the ohmic contacts produces lasing in the active layers of the semiconductor stacks on the opposite sides of the tunnel junction.

In one embodiment, the tunnel junction is provided by separate highly doped p+, n+layers between the stacks. This assembly of adjacent stacks and the tunnel junction comprises, seriatim, p, n, n+, p+p, n, n+, p+, p and n layers. In another embodiment, the tunnel junction is provided by highly doped abutting p+, n+adjacent surface portions in the adjacent stacks.

In one embodiment, the ends of the semiconductor stacks are reflecting and form a cavity, and the laser beams are emitted through one end of the stacks.

When so desired, the top and bottom stacks are dimensioned and formulated to provide reflecting dielectric mirrors at the top and bottom of the assembly and thereby confine the lasing therebetween and produce a surface emitting assembly. The substrate permit the laser beam to exit from the bottom or top dielectric mirror of the laser diode assembly. The dielectric mirrors may be provided by quarter wave thick layers of compatible low and high index of refraction semiconductors. In one embodiment, the substrate and its ohmic contact are configured to provide an aperture for the laser beam to exit. In another embodiment, the dimensions and composition of the semiconductor layers of the stacks and substrate cooperate to generate a laser beam of a wavelength to which the substrate is transparent.

In one form of the invention, at least one of the laser stacks has an active layer which provides a multiple quantum well. In another form, positive distributed feedback is provided by periodic corrugation on at least one side of the active layer and the laser beam is emitted through one end of the assembly.

If so desired, at least two of the stacks are of different composition to provide laser beams of at least two different wavelengths.

Tunnel junctions are usually provided between all of the stacks. However, in one embodiment, no tunnel junction is provided between one pair of the adjacent stacks to provide, seriatim, p,n,p,n layers for this pair to exhibit optoelectronic triggering inherent in p-n-p-n structures.

DETAILED DESCRIPTION OF THE PREFERRED EMBODIMENT

As will be pointed out hereinafter, the laser diode assemblies of the present invention comprise a multiplicity of semiconductor laser stacks with tunnel junctions therebetween to provide a multiplicity of lasing active layers, each generating a laser beam output.

Figure 1:
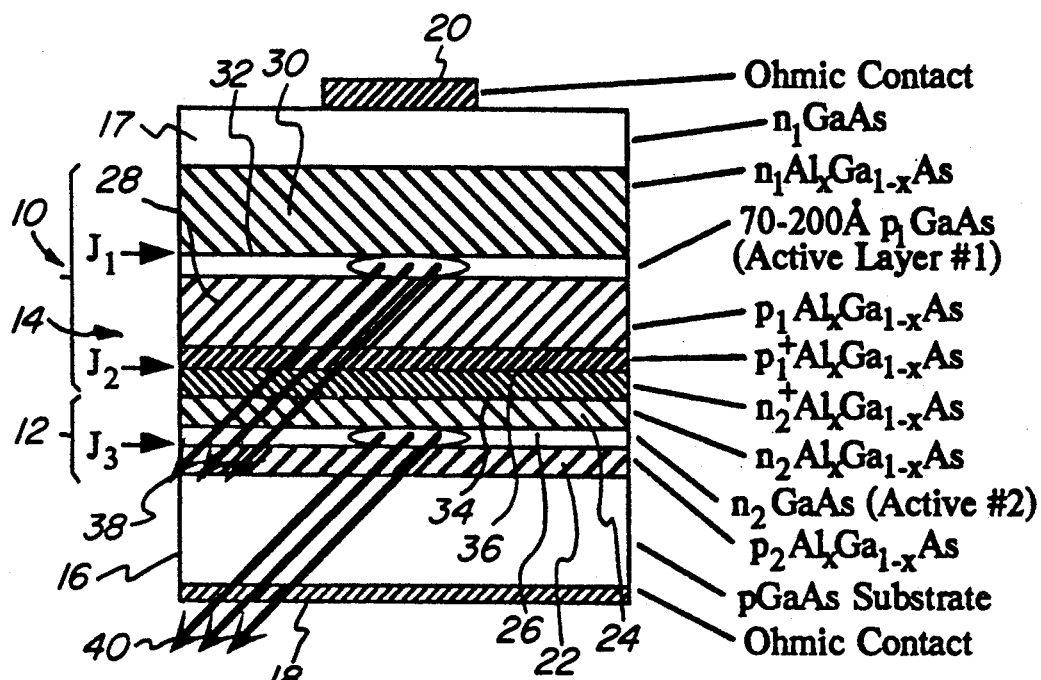
FIG. 1 is a schematic illustration of a laser diode assembly embodying the present invention and comprised of a pair of laser diodes with internal junction therebetween and emitting two laser beams through an edge thereof.

Turning first to FIG. 1, it can be seen that this embodiment of the present invention includes two semiconductor laser stacks generally designated by the numerals 10, 12 and separated by a tunnel junction generally designated by the numeral 14. The assembly has a semiconductor substrate 16 with an ohmic contact 18 on its outer surface, and it has an ohmic contact 20 on the outer surface of an upper semiconductor cap 17. Lateral carrier confinement is accomplished by conventional stripe geometry laser techniques (e. g., proton bombardment or buried heterostructure) and is not shown.

The lower stack 10 comprises p and n layers 22, 24, respectively, disposed on the p substrate and separated by an n active layer 26. The upper stack comprises p and n layers 28, 30, respectively, separated by the p active layer 32. The tunnel junction 14 comprises highly doped n+, p+ layers 34, 36, respectively.

When a potential is applied across the ohmic contacts 18 and 20, lasing is produced in the active layers 26, 32 and laser beams 38, 40 exit one end of the assembly.

Figure 2:
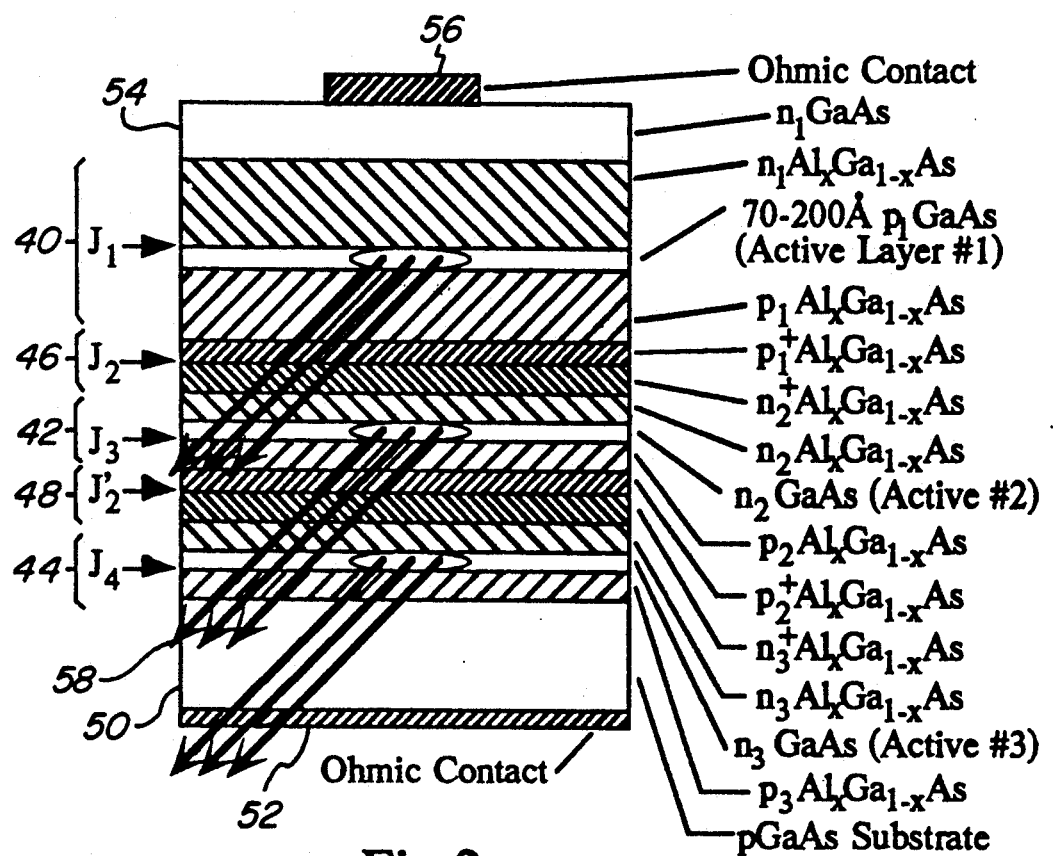
FIG. 2 is a similar view of a laser diode assembly comprised of three laser diodes emitting three laser beams through an edge thereof.

Turning next to FIG. 2, this embodiment includes three laser diode stacks generally designated by the numerals 40, 42 and 44 separated by a pair of tunnel junctions generally designated by the numerals 46, 48. A substrate 50 and ohmic contact 52 are provided on the bottom of the assembly and a semiconductor cap 54 and ohmic contact 56 are provided at the top of the assembly. This assembly produces lasing in the active layers of each of the laser diode stacks and results in generation of three laser beams.

Figure 3:
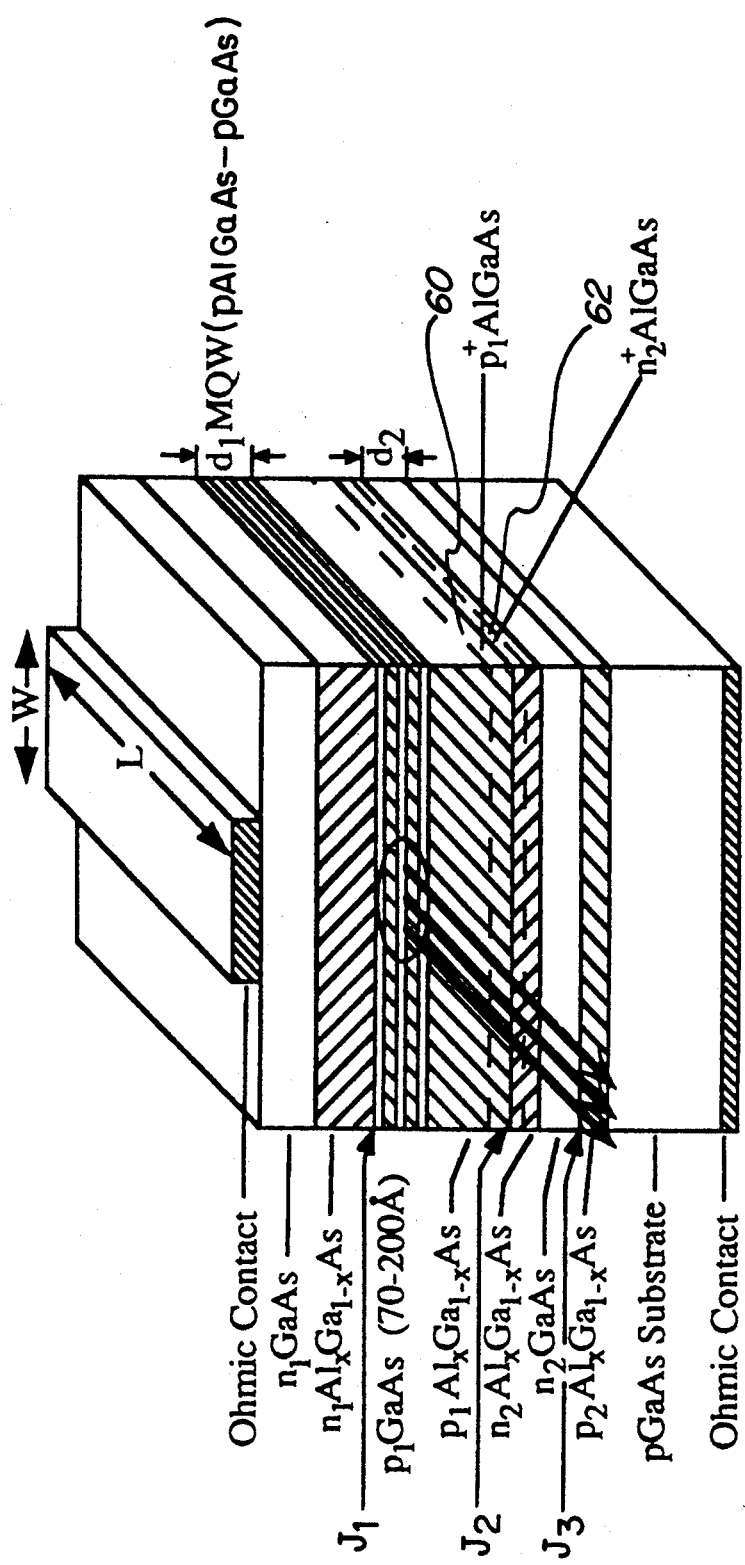
FIG. 3 is a view of a modification of the two diode laser of FIG. 1 to utilize a 3-D multiple quantum well active layer in the upper diode.

Instead of separate, highly doped semiconductor layers as shown in FIGS. 1 and 2, the adjacent or opposed , n layers of a pair of diode stacks may have highly doped abutting surface portions to provide the tunnel junction. In FIG. 3, the adjacent p, n layers of the adjacent laser diode stacks have highly doped surface portions 60, 62 indicated by the dotted lines to provide a tunnel junction $J_2$ therebetween.

When the constituent layers of junction $J_2$ (i e., $p_1$AlGaAs and $n_2$AlGaAs) are doped heavily, this results in a very small negligible voltage drop across $J_2$, and $p_1^+$AlGaAs-$n_2^{30}$AlgaAs can be considered as a tunnel junction with a very small reverse-breakdown voltage. This tunnel junction essentially acts as an ohmic contact and electrically decouples junctions $J_1$ and $J_3$. Under this circumstance, the triggering capability is diminished. However, if one regular p-n or n-p junction is also incorporated in a diode assembly of the present invention, the optoelectronic triggering ability of a p-n-p-n type device can be introduced.

In FIG. 1, the active layer 32 is of single quantum well thickness. However, in the embodiment of FIG. 3, the active layer 68 is configured as a multiple quantum well laser. In FIG. 1, the $p_1$GaAs single quantum well active region is sandwiched between $n_1$AlGaAs and $p_1$AlGaAs layers, while FIG. 3 shows the $p_1$-active layer comprised of GaAs-AlGaAs multiple quantum well (MQW) layers sandwiched between $n_1$AlGaAs and $p_1$AlGaAs layers. In addition, the active region can be implemented as a strained layer structure in a manner reported for conventional laser diodes to reduce threshold current density by Suemune et al, *Extremely Wide Bandwidth In a Low Threshhold Current Strained Quantum Well Laser,* Appl. Phys. Lett. 53, pp 1378-1380 (1988).

In the embodiments illustrated in FIGS. 1-3, the laser diode assemblies have been edge emitting; however, the laser diode assemblies of the present invention may be fabricated so as to be surface emitting.

Figure 4:
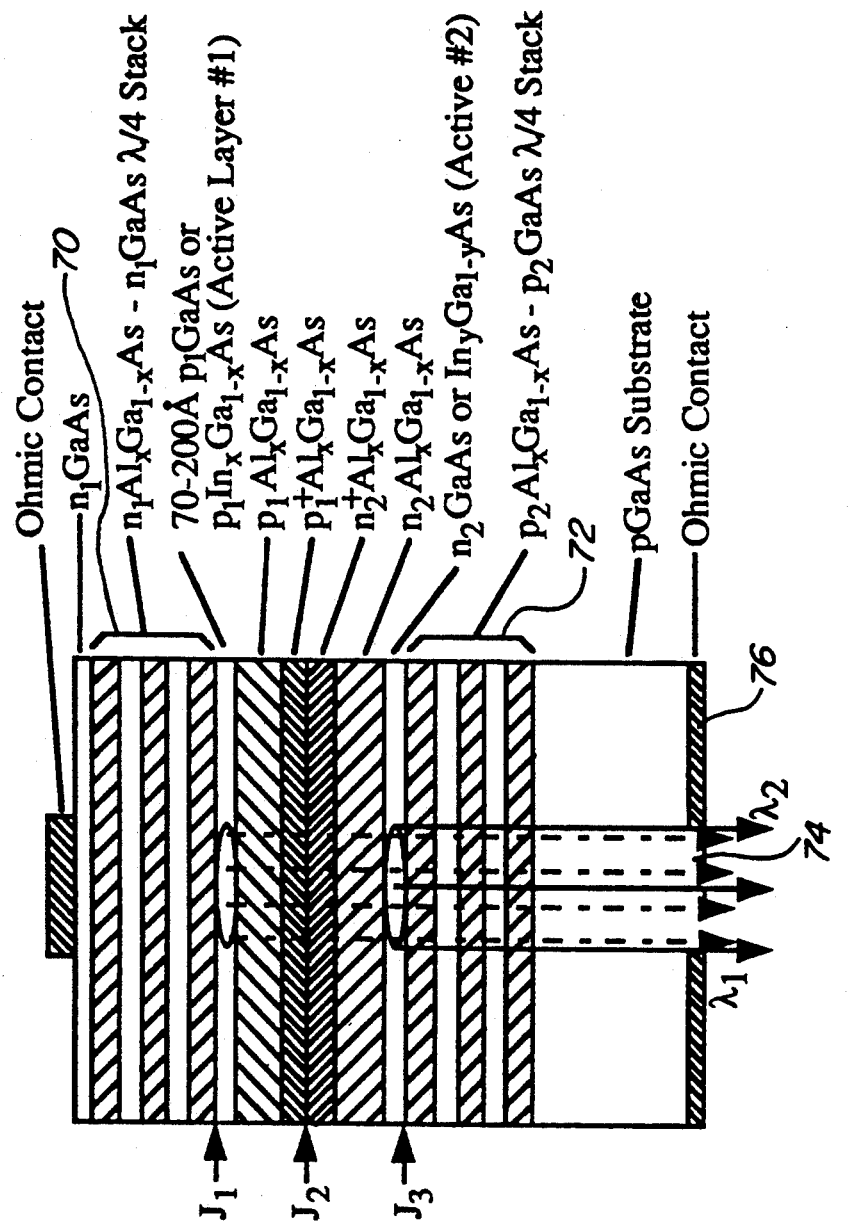
FIG. 4 is a similar view illustrating a two laser diode assembly utilizing dielectric mirrors and providing bottom surface emissions of the laser output from the diodes.

FIG. 4 shows a surface emitting configuration of a $n_1$-$p_1$-$n_2$-$p_2$ type laser with dielectric mirrors 70, 72 provided by n-doped AlGaAs-GaAs quarter wave ($\lambda/4$) stacks. The cavity length L is the separation between the dielectric mirrors. The dielectric mirrors are shown to be realized in the n-region adjacent to $n_1$GaAs emitter and pGaAs substrate layers. Alternatively, $n_1$AlGaAs emitter could serve both as emitter and as part of the mirror stack. Here, $p_1$InGaAs is the active layer. The laser output is through the bottom surface layer of the p-type stack and an aperture of 74 in the ohmic contact 76. The regions or layers outside of the broken vertical lines can be etched and replaced by polyimide (or other insulating materials) in a mushroom or column shape as described in Y. J. Yang et al, *Single-Mode Operation of Mushroom Structure Surface Emitting Lasers,* IEEE Photonics Technology Letter 3, pp 9-11 (January 1991) and Y. H. Lee et al, *Room Temperature Continuous-Wave Vertical-Cavity Single-Quantum-Well Microlaser Diodes,* Electron Letter 25, pp 1377-1308 (1989).

Figure 5:
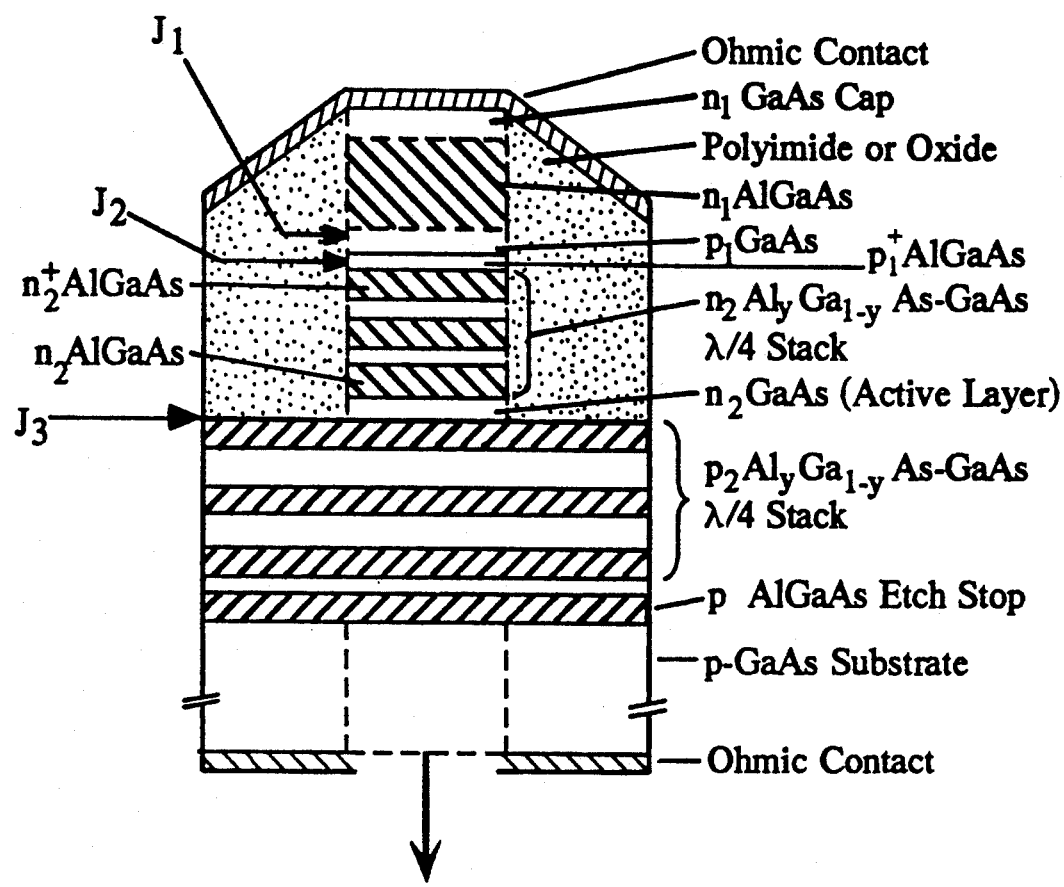
FIG. 5 is a similar view of another assembly in which the laser beam/is emitted from the bottom surface of the assembly and utilizing chemical modification of the sides of the upper diode layer to produce isolation.

Alternatively, an $n_2$GaAs active layer may be used as an active layer by sandwiching it between $\lambda/4$ AlGaAs-GaAs stacks realized in $n_2$ and $p_2$ regions, respectively. In this case, the output could be derived by etching the p-GaAs substrate as shown in FIG. 5 in a manner reported by R. S. Geels et al. in *Low Threshold Planarized Vertical-Cavity Surface Emitting Lasers,* IEEE Photonics Technology Letters, 2, pp. 234-236, (April 1990). In the illustrated embodiment of FIG. 5, the laser output is also through the bottom surface of the assembly. In the embodiment of both FIG. 4 and 5, a tunnel junction $J_2$ is provided between the upper and lower laser diode stacks.

Figure 6:
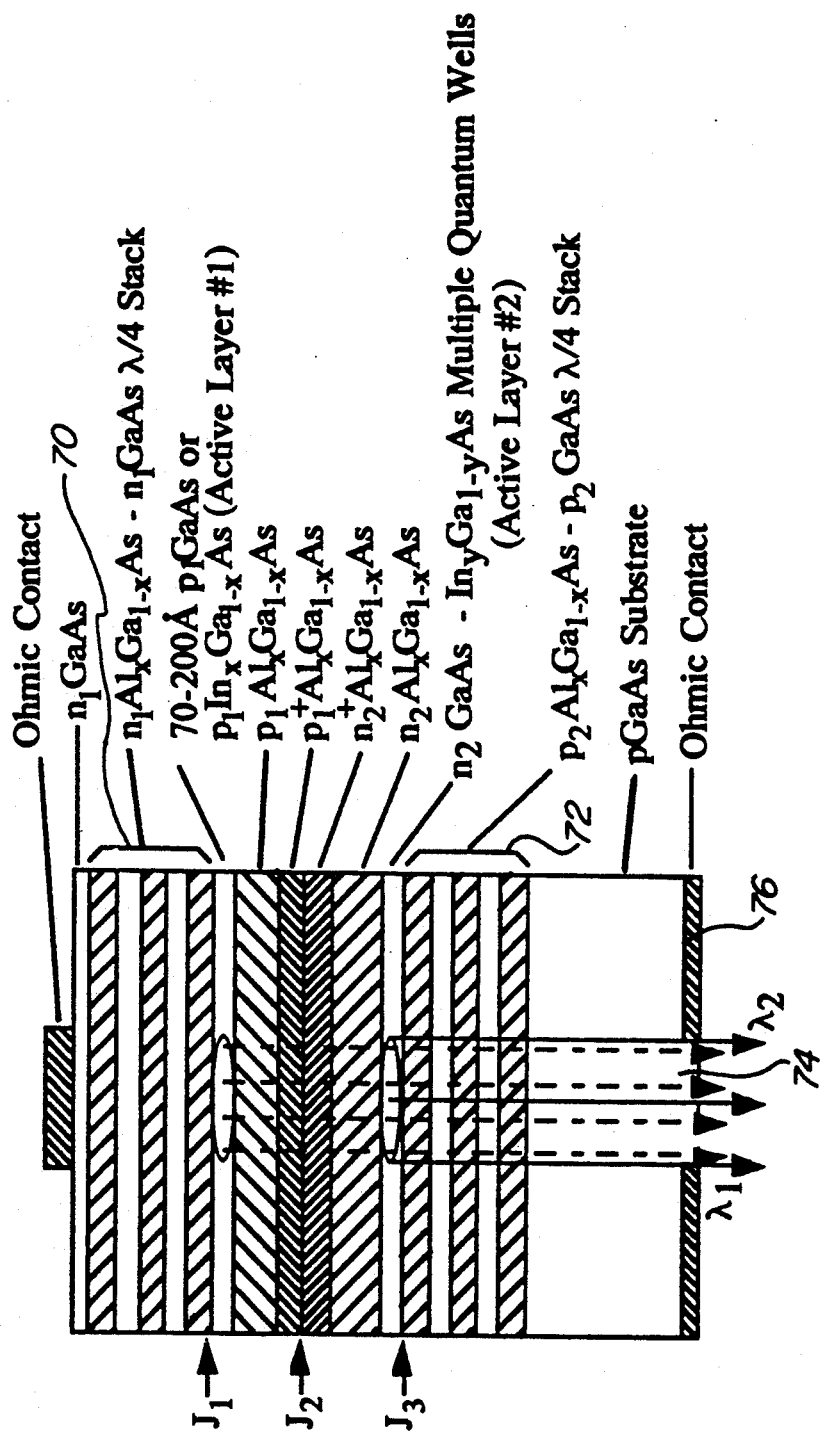
FIG. 6 is a similar view of another laser diode assembly having a multiple quantum well active layer in the upper diode and producing laser emission through the bottom surface of the assembly.

A multiple quantum well surface emitting laser is shown in FIG. 6 wherein the laser output is through an aperture in the ohmic contact in the bottom surface of a diode assembly embodying the present invention. This structure could be further configured in Surface-cutting (topside) as proposed by Geels et al, *supra,* or as proposed by Y. J. Yang et al., in *Single-Mode Operation of Mushroom Structure Surface Emitting Lasers,* IEEE Photonics Technology Lett., 3, pp. 9-11, (January 1991) by using appropriate etching and polyimide/insulator deposition techniques.

In any of the illustrated embodiments, internal confinement within the desired volume of the layers of a stack may be effected by ion implantation or other conventional techniques used in laser diodes.

Figure 7:
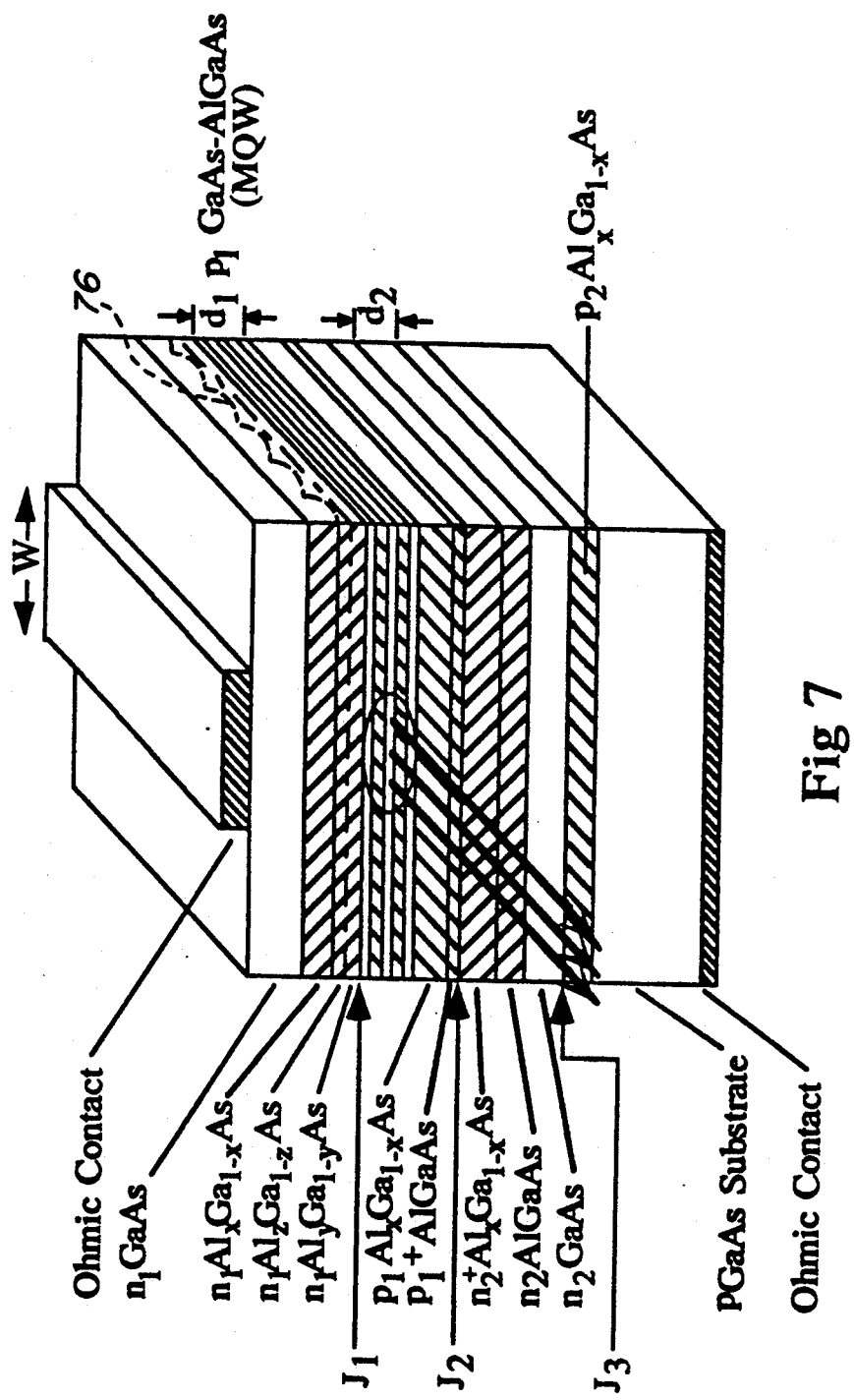
FIG. 7 is a similar view showing a laser diode assembly with a multiple quantum well structure for the active layer of the upper diode and periodic corrugation to produce distributed feedback.

Turning now to FIG. 7, the laser diode assembly may be adapted to a distributed feedback configuration in a manner similar to that used in conventional laser diodes as described by K. Aiki, et al in *GaAs-AlGaAs Distributed Feedback Laser with Separate Optical and Carrier Confinement,* Appl. Phys. Lett., 27, p. 145, (1975). Both edge-emitting and surface-emitting structures are feasible.

The $n_1p_1p_1^+$-$n_2^+r_2$-$p_2$ structure of FIG. 7 is shown in the edge-emitting distributed feedback configuration and the broken line 76 illustrates periodic corrugation. The periodic structure provides the feedback for the photons leaking from the active layer ($p_1$GaAs) into the $n_1$Al$_2$Ga$_{1-z}$As layers. In this embodiment, there is shown a stripe geometry AlGaAs-GaAs multiple quantum well (MQW) distributed feedback $n_1$-$p_1$-$n_2$-$p_2$ laser. The composition of the $n_1$AlGaAs layer is $x$ TM 0.3, y=0.17, z=0.07). Variations of this embodiment can be effected by providing the periodic corrugation in the $p_1GaAs$ (via $p_1AlGaAs$) or $n_2AlGaAs$ layers.

Figure 8:
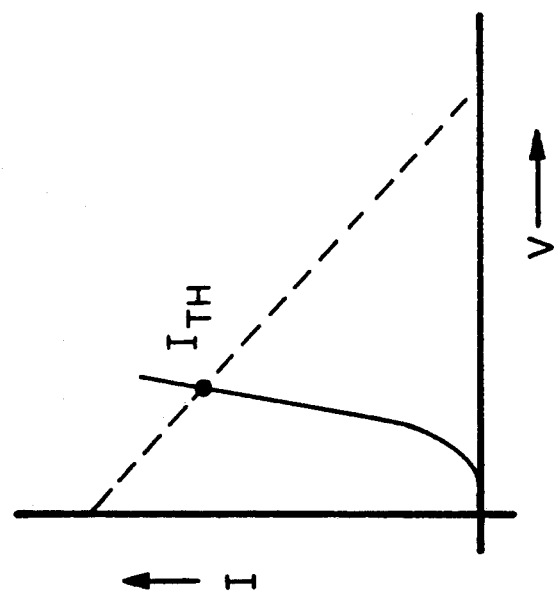

The operation of conventional DFB laser diodes structures has also been reported in the surface emitting mode by S. H. Macomber et al. in *Surface-Emitting Distributed Feedback Semiconductor Laser*, Appl. Phys. Lett., 51, pp. 472-474, (1987). Generally, the feedback is provided by forming a grating (a corrugated layer as shown in FIG. 8) in the plane of the growth. However, L. M. Miller et al. has recently described in *"A Distributed Feedback Ridge Waveguide Quantum Well Heterostructure Laser"*, IEEE Photonics Tech. Lett., 3, pp. 6-8, (January 1991), the use of grating etched along the side of the laser stripe to provide both feedback and lateral confinement in a ridge waveguide configuration.

In one embodiment in which there are three or more laser diode stacks and tunnel junctions are provided only between two pairs and none is provided between the third pair, the two junctions in tandem will behave similar to a semiconductor controlled rectifier (SCR). The use of multiple junctions provides additional design flexibility and features not readily realized in conventional single p-n junction laser diodes (LDs). For example, a $p_1$-$n_1$-$p_2$-$n_2$ multiple junction laser can be triggered electronically or optically from a "forward blocking (non-lasing)" to a "forward on (lasing) state. The electronic triggering can be achieved, as is done in conventional SCRs, by applying appropriate pulses/signals to the gate terminals contacting $n_1$ and/or $p_1$ regions. By contrast, the optical triggering involves generating electron-hole pairs (EHPs) in the $n_1$- and/or $p_2$- regions to initiate the regenerative process.

The heterostructures of the present invention are quite similar to the conventional semiconductor lasers in so far as the photon confinement and feedback arrangements are concerned. The multijunction lasers can be designed in either the cavity type or distributed feedback (DFB) stripe geometry configurations.

Figure 9:
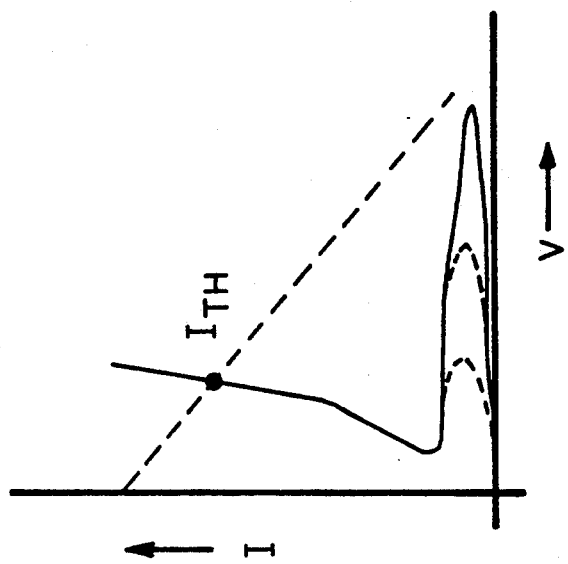
FIGS. 8 and 9 are diagrammatic views illustrating voltage and current characteristics of a conventional p-n diode and a p-n-p-n diode p*/d utilized in a diode assembly assembly of the present invention.

The primary difference between the multijunction lasers of the present invention and conventional semiconductor laser diodes is in their voltage-current characteristics. FIG. 8 schematically shows typical characteristics of p-n diodes, and FIG. 9 those of a p-n-p-n diode assembly of the present invention where one p-n junction is incorporated in addition to tunnel junction. These figures are schematic representations of forward voltage (V) and Current (I) characteristics. However $I_{TH}$, the threshold current for laser emission, is not shown to scale or comparatively.

Reference may be made to the literature for the details of various device characteristics. Unlike p-n diodes, the forward voltage-current characteristics of p-n-p-n pairs are dependent on the state of other junctions.

The magnitude of the operating forward current should be such as to provide enough minority carrier injection in the active layer region. In addition, the active region should be constructed using a material in which efficient recombination of injected minority carriers can take place to generate photons. This condition is similar to that observed in conventional laser diodes. Once the photons are generated in the active region, they need to be built up to obtain stimulated emission and lasing. The optimization of threshold current density $J_{TH}$ is accomplished by approximately designing the heterostructures sandwiching the active layer to obtain carrier and photon confinements.

Turning again to FIG. 1, the device consists of $n_1Al$-$GaAs$-$p_1GaAS$-$n_2AlGaAs$/$n_2GaAS$-$p_2AlGaAs$ layers grown on a GaAs substrate having appropriate buffer layer(s). In addition, the $n_1AlGaAs$ is shown with a $n_1GaAs$ cap layer (0.02–0.1 $\mu$m) for facilitating the ohmic contact stripe. Three p-n heterojunctions are labeled in FIG. 1. The device thus has two regions which can serve as potential active layers. These are identified, respectively, with the contact stripe and the threshold current density $J_{TH}$ is dependent on the active layer thickness.

The construction of junction $J_2$ (i.e., doping levels and thicknesses of constituent layers) is critical in the determination of V and electrical behavior in the case of the tunnel junction.

As previously pointed out, the active layer in a p-n-p-n structure can be designed to realize single and multiple quantum well lasers. FIGS. 1 and 3 show two $n_1$-$p_1$-$n_2$-$p_2$ devices in which $p_1GaAs$ active layer is used in the single and multiple quantum well formats. In FIG. 1, the $p_1GaAs$ single quantum well active region is sandwiched between $n_1AlGaAs$ and $p_2AlGaAs$ layers, while FIG. 3 shows the $p_1$-active layer comprised of GaAs-AlGaAs multiple quantum well (MQW) layers sandwiched between $n_1AlGaAs$ and $p_1AlGaAs$ layers. In addition, the active region be implemented as a strained layer structure in a manner reported recently for conventional laser diodes by Suemune et al, supra, to reduce threshold current density.

It may be added that FIG. 1 and FIG. 4 utilize a simplistic stripe geometry structure to illustrate the basic operation. Elaborate structures, including buried active layer heterostructures, can be fabricated to obtain improved lateral confinement for single mode operation.

As seen, the structures of FIG. 3, the surface portions of junction $J_2$ (i.e., $p_1AlGaAs$ and $n_2AlGaAs$) are doped heavily to provide a tunnel junction so that there is a very small and negligible $v_p$ as the drop across $J_2$ is negligible, i e , a very small reverse-breakdown voltage. This tunnel junction essentially acts as an ohmic contact and electrically decouples junctions $J_1$ and $J_3$. As a result, the triggering capability is diminished. However, one obtains multiple lasing outputs from the active layers of vertically integrated or cascaded p-n heterojunctions (separated by tunnel junctions). To provide the triggering aspect, one pair of laser diode stacks in the assembly may omit the tunnel junction therebetween.

As is well known, various techniques may be used to limit the area of the stacks in the assembly in which the current flows and the lasing takes place. For example, limiting the width of the ohmic contact on the top of the laser diode assembly may be combined with techniques for modifying the side margins of the layers to render them highly resistive. Various such techniques for stripe geometry limitation are described in Casey et al., *Heterostructure Lasers Part B: Materials and Operating Characteristics*, pp. 207-217 (Academic Press, 1978), and in Cheo, *Fiber Optics and Optoelectronics*, pp 237-297 (Prentice Hall 1990).

Although most of the illustrated laser assemblies have utilized gallium arsenide/aluminum gallium arsenide systems, other chemistries may be employed including, as the active layer, indium gallium arsenide, indium gallium arsenide phosphide, zinc selenide, zinc cadmmium selenide, and zinc sulfur selenide. These provide an active layer of direct energy gap materials or materials hosting excitons.

The active layers should be sandwiched between confinement layers which provide carrier and photon confinement. Invariably, these confinement layers are semiconductors with a wide energy gap.

Devices of the present invention may operate highly efficiently in application where multiple laser beams and/or beams of multiple wavelengths may be employed, such as fiberoptic cable transmission lines. By providing a standard assembly with high efficiency the diode assembly may be dimensioned and configured to cooperate with multiple fibers of a fiberoptic cable. Multiple wavelengths from the diode stacks may be used to simultaneously transmit multiple signals.

Thus, it can be seen from the foregoing detailed description and attached drawings that the novel laser diode assemblies of the present invention are efficient in their use of applied current and may be customized for various applications such as those in which multiple beams of different wavelengths are generated, or the output beams from each of the several active layers may be combined in a single laser beam of relatively high power. The laser diode assemblies may be fabricated relatively easy using conventional and known techniques and modified as required for the particular application and the particular characteristics desired for the output beam.

Having thus described the invention, what is claimed is:

1. A laser diode assembly providing multiple output beams from multiple p-n junctions and at least one tunnel junction comprising:
   (a) a semiconductor substrate;
   (b) a multiplicity of superposed semiconductor laser stacks thereon each having an active layer sandwiched between p and n layers, and at least one pair of adjacent semiconductor laser stacks having a tunnel junction therebetween; and
   (c) ohmic contacts on the outer surface of said substrate and the outer surface of the uppermost semiconductor laser stack, whereby an applied potential across said ohmic contacts produces lasing in the active layers semiconductor laser stacks on the opposite sides of said tunnel junction.

2. The laser diode assembly in accordance with claim 1 wherein the ends of said semiconductor stacks are reflecting and form a cavity, and wherein laser beams are emitted through one end of said stacks.

3. The laser diode assembly in accordance with claim 1 wherein said tunnel junction is provided by highly doped $p^+$, $n^+$ layers between said stacks.

4. The laser diode assembly in accordance with claim 3 wherein an assembly of adjacent stacks and tunnel junction comprises, seriatim, p, n, $n^+$, $p^+$p, n, $n^+$, $p^+$, p and n layers.

5. The laser diode assembly in accordance with claim 1 wherein said tunnel junction is provided by highly doped abutting $p^+$, $n^+$ surface portions in the adjacent stacks.

6. The laser diode assembly in accordance with claim 1 wherein the top and bottom stacks are dimensioned and formulated to provide reflecting dielectric mirrors at the top and bottom of the assembly and thereby confine the lasing therebetween.

7. The laser diode assembly in accordance with claim 6 wherein said substrate permits the laser beam to exit from the bottom dielectric mirror of the laser diode assembly.

8. The laser diode assembly in accordance with claim 6 wherein said dielectric mirrors are realized by quarter wave thick layers of compatible low and high index of refraction semiconductors.

9. The laser diode assembly in accordance with claim 7 wherein said substrate and its ohmic contact are configured to provide an aperture for the laser beam to exit.

10. The laser diode assembly in accordance with claim 7 wherein the dimensions and composition of the semiconductor layers of said stacks and substrate cooperate to generate a laser beam of a wavelength to which the substrate is transparent.

11. The laser diode assembly in accordance with claim 1 wherein at least one of said laser stacks has an active layer which provides a multiple quantum well.

12. The laser diode assembly in accordance with claim 1 wherein positive distributed feedback is provided by periodic corrugation on at least one side of the active layer of at least one stack and the laser beams are emitted through one end of the assembly.

13. The laser diode assembly in accordance with claim 1 wherein at least two of said stacks are of different composition to provide laser beams of at least two different wavelengths.

14. The laser diode assembly in accordance with claim 1 wherein tunnel junctions are provided between all of said stacks.

15. The laser diode assembly in accordance with claim 1 wherein tunnel junctions are provided between all but one pair of said adjacent stacks to provide, seriatim, p,n,p,n layers in said but one pair, to exhibit optoelectronic triggering inherent in p-n,p-n structures.

* * * * *